(12) United States Patent
Lee

(10) Patent No.: US 11,063,234 B2
(45) Date of Patent: Jul. 13, 2021

(54) ORGANIC LIGHT EMITTING DIODE DISPLAY PANEL AND METHOD FOR MANUFACTURING THE SAME

(71) Applicant: WUHAN CHINA STAR OPTOELECTRONICS SEMICONDUCTOR DISPLAY TECHNOLOGY CO., LTD., Hubei (CN)

(72) Inventor: Jinseok Lee, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 9 days.

(21) Appl. No.: 16/489,414

(22) PCT Filed: Jan. 2, 2019

(86) PCT No.: PCT/CN2019/070120
§ 371 (c)(1),
(2) Date: Aug. 28, 2019

(87) PCT Pub. No.: WO2020/113749
PCT Pub. Date: Jun. 11, 2020

(65) Prior Publication Data
US 2020/0328370 A1    Oct. 15, 2020

(30) Foreign Application Priority Data
Dec. 5, 2018 (CN) .......................... 201811483050.4

(51) Int. Cl.
*H01L 51/52* (2006.01)
*H01L 27/32* (2006.01)
(Continued)

(52) U.S. Cl.
CPC ...... *H01L 51/5218* (2013.01); *H01L 27/3244* (2013.01); *H01L 51/0023* (2013.01);
(Continued)

(58) Field of Classification Search
CPC ............ H01L 51/5218; H01L 27/3244; H01L 51/0023; H01L 51/5209
See application file for complete search history.

(56) References Cited

U.S. PATENT DOCUMENTS

2006/0091791 A1  5/2006  Shin
2019/0097166 A1*  3/2019  Gong ................. H01L 51/0022

FOREIGN PATENT DOCUMENTS

CN    1780022 A    5/2006
CN    103928635 A    7/2014
(Continued)

*Primary Examiner* — Anthony Ho

(57) ABSTRACT

A method for manufacturing an organic light emitting diode (OLED) display panel includes providing an array substrate; forming a first indium tin oxide (ITO) layer, a reflective layer, and a second ITO layer on the array substrate in order, wherein a film thickness of the second ITO layer is greater than a film thickness of the first ITO layer; forming a patterned photoresist on the second ITO layer; etching the second ITO layer, the reflective layer, and the first ITO layer by a same etching process to form a patterned anode layer; forming an OLED light emitting layer on the anode layer.

9 Claims, 4 Drawing Sheets

(51) Int. Cl.
 H01L 51/00 (2006.01)
 H01L 51/56 (2006.01)
(52) U.S. Cl.
 CPC .......... H01L 51/5209 (2013.01); H01L 51/56 (2013.01); *H01L 2227/323* (2013.01); *H01L 2251/308* (2013.01)

(56) References Cited

FOREIGN PATENT DOCUMENTS

| | | | |
|---|---|---|---|
| CN | 104466025 A | 3/2015 | |
| CN | 104701460 A | 6/2015 | |
| CN | 107507920 A | * 12/2017 | ......... H01L 51/5209 |

* cited by examiner

ORGANIC LIGHT EMITTING DIODE DISPLAY PANEL AND METHOD FOR MANUFACTURING THE SAME

FIELD OF INVENTION

The present disclosure relates to a field of display technologies, and more particularly to an organic light emitting diode (OLED) display panel and a method for manufacturing the same.

BACKGROUND OF INVENTION

Organic light emitting diode (OLED) display technologies have become objects of research in a field of optoelectronics, owing to having advantages such as self-illumination, wide viewing angle, high contrast, low power consumption, high response speed and so on. The OLED display can be divided into a top emission type and a bottom emission type according to an emitting way of the light. Since the light of a conventional bottom-emitting OLED device needs to pass through a underlying array substrate, metal devices on the array substrate may block a part of the light, and the OLED device may have several issues such as a low aperture ratio; the light of a top-emitting OLED device emits from an upper side of a OLED light emitting layer, and the top-emitting OLED device can avoids a problem of a low aperture, since the light does not need to pass through the array substrate. In the top-emitting OLED display, structures and performances of an anode are key factors in determining the performance of the top-emitting OLED display, and there is a requirement that the anode has a high reflectivity and a high work function. Generally, composite materials are used as the anode of the top-emitting OLED display, and common composite anode materials mainly include transparent conductive oxides and metals.

Generally, a current composite anode adopts a way of a three-layer lamination film, and a middle layer is a metal film to increase the reflectance of the anode, and a top layer and a bottom layer both are oxides having a high work function. A patterned composite anode is formed generally by a lithography process, during etching the three-layer film, a photoresist covering the top layer may be lost as a etched depth is deepened, causing that other regions not to be etched of the top film layer are to be etched away, and exposing the regions not needed to be etched of a metal layer. As a result, a surface of the metal layer may change and results in quality deterioration and negatively affecting the performances of the OLED displays.

SUMMARY OF INVENTION

The present disclosure provides a method for manufacturing an organic light emitting diode (OLED) display panel to solve an issue affecting the performances of the display device in an existing method of manufacturing an OLED display panel, since the photoresist may be lost during an etching process when forming an OLED anode, the regions of a metal layer not to be etched are exposed, resulting in a change of a metal surface.

To solve the above issues, a technical solution provided by the present disclosure is described as follows:

An embodiment of the present disclosure provides an OLED display panel including an array substrate, an anode formed on the array substrate, and OLED light emitting layer formed on the anode layer. The array substrate includes a base substrate and a thin film transistor array disposed on the base substrate, and the anode layer includes a first Indium tin oxide (ITO) layer, a reflective layer, and a second ITO layer disposed in order. The second ITO layer covers the reflective layer, and a partial film thickness of the second ITO layer is greater than a film thickness of the first ITO layer. The first ITO layer, the reflective layer, and the second ITO layer are formed by a same etching process, and a material of the reflective layer is a silver metal.

In at least one embodiment of the present disclosure, the partial film thickness of the second ITO layer is twice of the film thickness of the first ITO layer.

An embodiment of the present disclosure further provides a method for manufacturing an OLED display panel, the method includes the following steps:

step S10, providing an array substrate comprising a base substrate and a thin film transistor array disposed on the base substrate;

step S20, forming a first indium tin oxide (ITO) layer, a reflective layer, and a second ITO layer on the array substrate in order, wherein a film thickness of the second ITO layer is greater than a film thickness of the first ITO layer;

step S30, forming a patterned photoresist on the second ITO layer;

step S40, etching the second ITO layer, the reflective layer, and the first ITO layer by a same etching process to form a patterned anode layer; and step S50, forming an OLED light emitting layer on the anode layer.

In at least one embodiment of the present disclosure, the film thickness of the second ITO layer is twice of the film thickness of the first ITO layer in the step S20.

In at least one embodiment of the present disclosure, an etching time of the second ITO layer is greater than an etching time of the first ITO layer.

In at least one embodiment of the present disclosure, the step S40 includes:

step S401, etching the second ITO layer by the photoresist as a self-alignment;

step S402, etching the reflective layer by the photoresist and the second ITO layer as a self-alignment; and step S403, etching the first ITO layer by the photoresist and the second ITO layer as a self-alignment, wherein the second ITO layer covers the reflective layer.

In at least one embodiment of the present disclosure, the photoresist is stripped so that after a patterning step, the first ITO layer, the reflective layer, and the second ITO layer together form the anode layer, after the step S40.

In at least one embodiment of the present disclosure, a partial film thickness of the second ITO layer is less than and equal to a film thickness of the first ITO layer after the etching process.

In at least one embodiment of the present disclosure, the step S20 includes:

step S201, evaporating the first ITO layer on the array substrate;

step S202, evaporating the reflective layer on the first ITO layer, the reflective layer is made of a silver metal material; and step S203, evaporating the second ITO layer on the reflective layer.

An embodiment of the present disclosure further provides an OLED display panel including an array substrate, an anode formed on the array substrate, and an OLED light emitting layer formed on the anode layer. The array substrate includes a base substrate and a thin film transistor array disposed on the base substrate, and the anode layer includes a first Indium tin oxide (ITO) layer, a reflective layer, and a second ITO layer disposed in order. The second ITO layer covers the reflective layer, and a partial film thickness of the second ITO layer is greater than a film thickness of the first ITO layer.

In at least one embodiment of the present disclosure, the first ITO layer, the reflective layer, and the second ITO layer are formed by a same etching process.

In at least one embodiment of the present disclosure, the partial film thickness of the second ITO layer is twice of the film thickness of the first ITO layer.

Beneficial performances of an embodiment of the present disclosure are that, in a method for manufacturing an OLED display panel of the embodiment of the present disclosure, by increasing a film thickness of a top ITO layer, a surface of the underlying metal layer is prevented from being affected because of the photoresist lost during an etching process, and thereby ensuring a quality stability of the OLED display panel.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
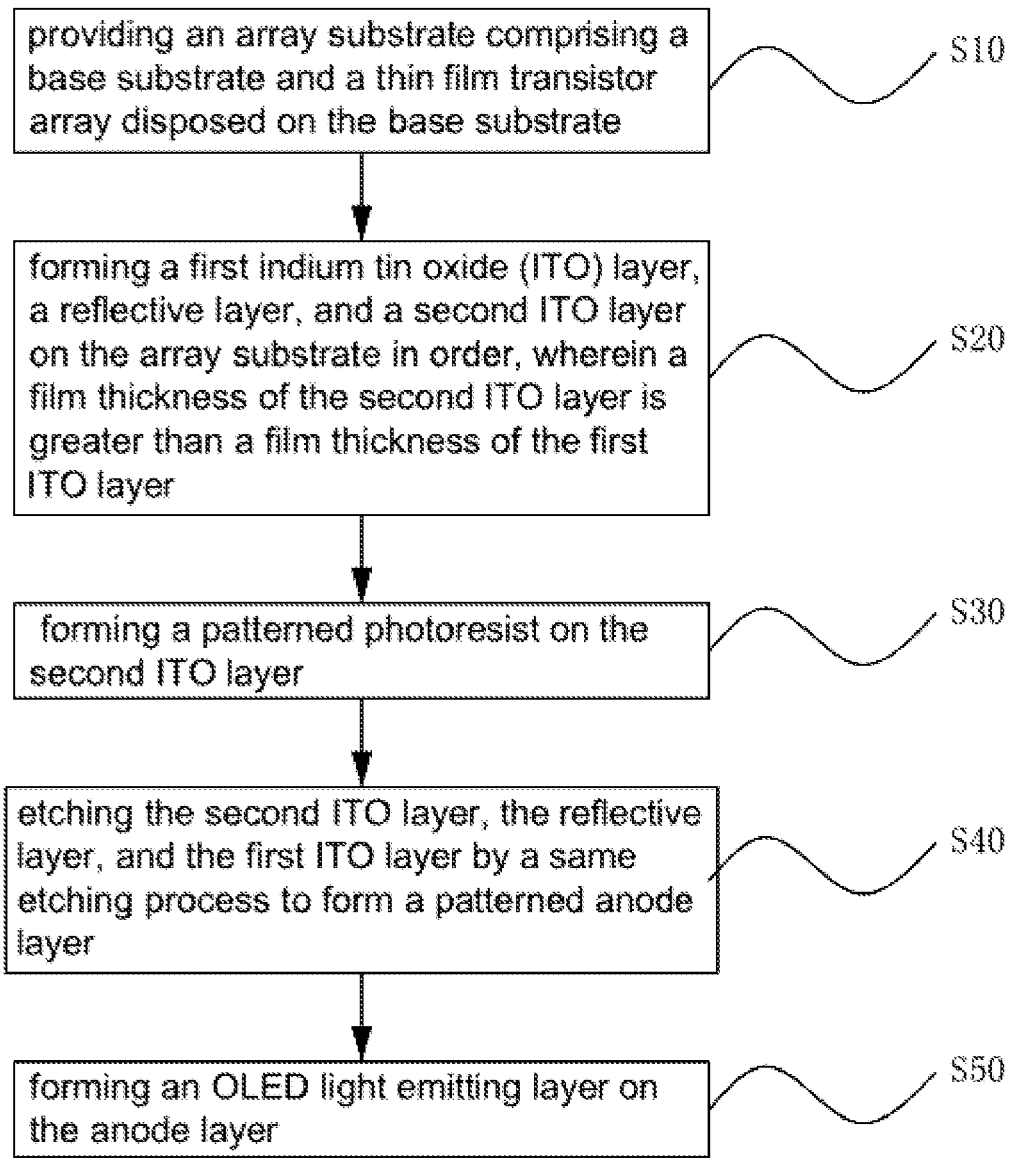
FIG. 1 is a flow chart of steps of a method for manufacturing an organic light emitting diode (OLED) display panel according to the present disclosure.

The following description of the various embodiments is provided to illustrate the specific embodiments. Directional terms described by the present disclosure, such as top, bottom, front, back, left, right, inner, outer, side, etc., are only directions by referring to the accompanying drawings, and thus the used terms are used only for the purpose of describing embodiments of the present disclosure and are not intended to limit the present disclosure. In the drawings, units with similar structures are labeled with the same reference number.

The embodiment of the present disclosure can solve defects of the prior art, in which a method for manufacturing an organic light emitting diode (OLED) display panel of the prior art, in a process of manufacturing an OLED anode, a photoresist may be lost during an etching process, causing the regions not to be etched of a metal layer exposed, and resulting in a change in the properties of the metal layer surface, thereby the performances of the OLED display device are negatively affected.

Figure 2:
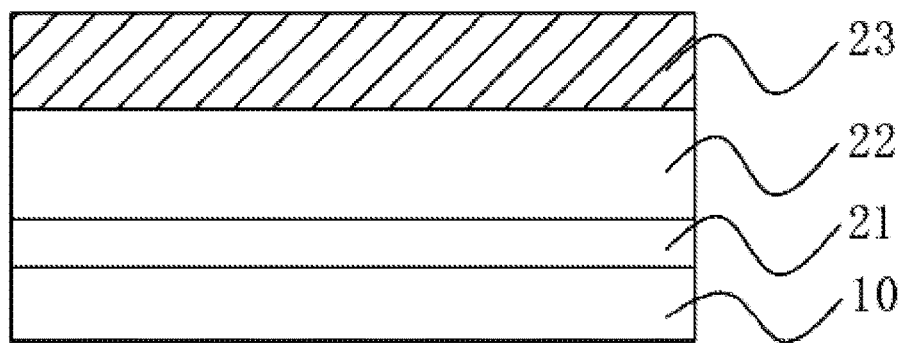
FIG. 2 to FIG. 4 are schematic structure diagrams of an OLED display panel according to the present disclosure in the process of manufacturing the OLED display panel.

Referring to FIG. 1, the embodiment of the present disclosure provides a method for manufacturing an organic light emitting diode (OLED) display panel, the method includes the following steps:

Step S10, providing an array substrate 10 including a base substrate and a thin film transistor array, referring to FIG. 2.

The base substrate can be a glass substrate or flexible substrate such as polyimide substrate, and the thin film transistor array includes an active layer, a source drain, and a gate. A gate insulating layer, a interlayer insulating layer, and a pixel defining layer was further disposed on the array substrate, the structure thereof can be referred to the prior art, and there will not be described.

Step S20, forming a first indium tin oxide (ITO) layer 21, a reflective layer 22, and a second ITO layer 23 on the array substrate in order, wherein a film thickness of the second ITO layer 23 is greater than a film thickness of the first ITO layer 21.

Firstly, an ITO material is evaporated on the array substrate 10 to form the first ITO layer 21.

And a metal material is deposited on the first ITO layer 21 to form the reflective layer 22, and the metal material is a silver in the embodiment. The silver can reflect the light of the OLED back owing to its high reflectivity.

Then, an ITO material is evaporated on the reflective layer 22 to form the second ITO layer 23.

When the second ITO layer 23 is evaporated, a film thickness of the second ITO layer 23 is greater than a film thickness of the first ITO layer 21 for the case where a photoresist is missing and an etching process is still continuing, the second ITO layer 23 can be not completely etched away, and a certain film thickness of the ITO layer 23 can be retained, thereby preventing the underlying reflective layer 22 from being etched.

Figure 3:
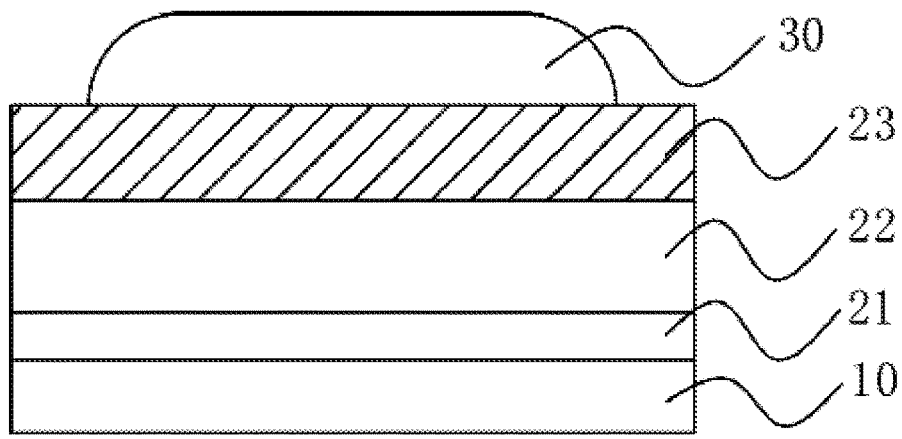

Step S30, forming a patterned photoresist 30 on the second ITO layer 23, referring to FIG. 3.

Firstly, a positive photoresist material is uniformly coated on the second ITO layer 23, then the photoresist material is irradiated with ultraviolet rays by a mask, after the exposing process, the photoresist material is developed by a developing solution, and the irradiated portion undergoes a chemical change, and dissolved in the developing solution, and a portion not irradiated with the ultraviolet rays is retained to form the patterned photoresist 30.

Step S40, etching the second ITO layer 23, the reflective layer 22, and the first ITO layer 21 by a same etching process to form a patterned anode layer.

Figure 4:
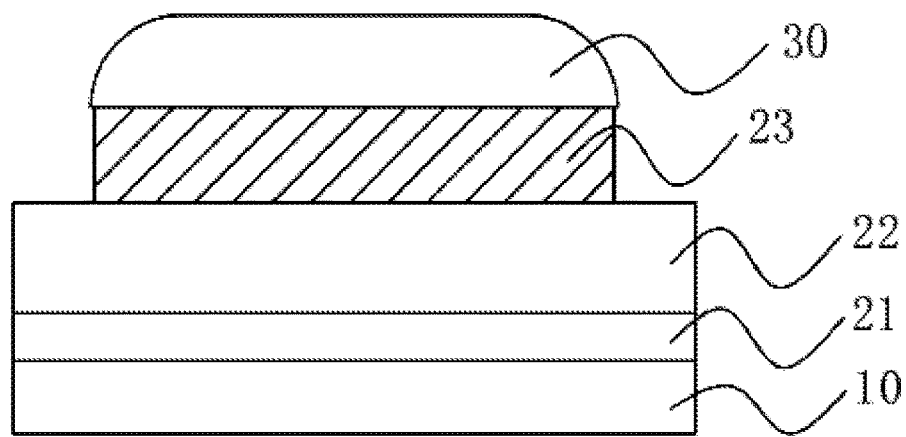

Referring to FIG. 4, the second ITO layer 23 is etched by a wet etching, by the photoresist 30 as a self-alignment, the portion of the second ITO layer 23 covered by the photoresist is retained, and the other portion is etched off. Since the wet etching has a lateral etching while etching along a thickness direction of the film, the wet etching may affect the etching precision. But the error is within the required accuracy range, and the wet etching has the advantages of fast etching rate, high selection ratio, and low price.

After that, by the photoresist 30 and the second ITO layer 20 as a self-alignment, the reflective layer 22 is etched to form a patterned reflective layer 22.

Figure 5:
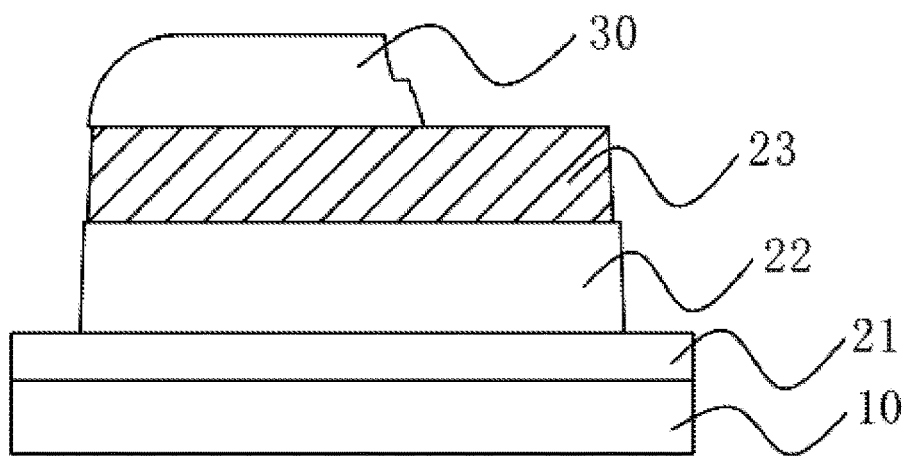
FIG. 5 to FIG. 7 are schematic structure diagrams of an OLED display panel according to the present disclosure in the absence of a photoresist.

Referring to FIG. 5, during the etching process, as an etching depth deepens and the etching time prolongs, the photoresist 30 may be missing, causing a part of the surface of the film layer to be exposed. As the etching time increases, the probability of the photoresist loss increases. FIG. 5 illustrates a structure in which the photoresist is missing after finishing etching the reflective layer 22.

Then, by the retained photoresist 30 and the exposed second ITO layer 23 as a self-alignment, the first ITO layer 21 is etched. A partial surface of the second ITO layer 23 is exposed due to a partial photoresist loss, so that the exposed portion of the second ITO layer 23 is also etched by the etching solution during the process of etching the first ITO layer 21.

In the previous step S20, the film thickness of the second ITO layer 23 is greater than the film thickness of the first ITO layer 21, so as to prevent the etching solution from etching the corresponding second ITO layer 23 away completely on the reflective layer 22. In the embodiment of the present disclosure, the film thickness of the second ITO layer 23 is twice of the film thickness of the first ITO layer 21, correspondingly, an etching time of the second ITO layer 23 is twice of an etching time of the first ITO layer 21.

Figure 6:
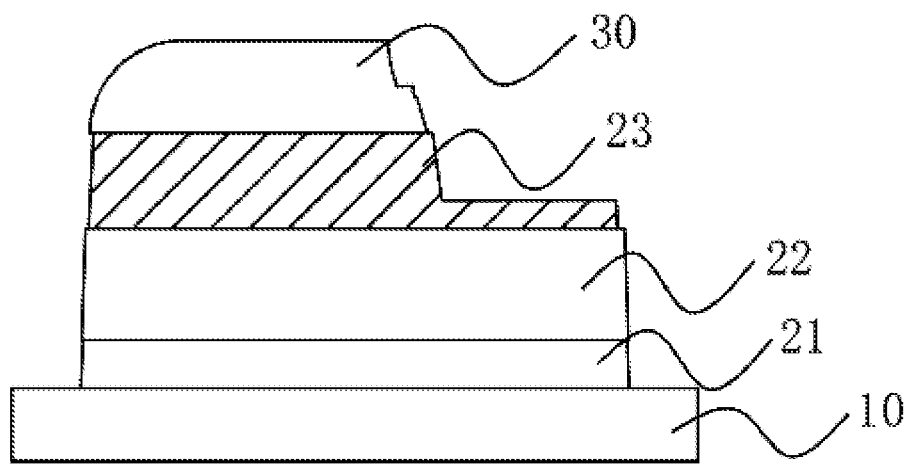

Referring to FIG. 6, after finishing etching the first ITO layer 21, the corresponding second ITO layer 23 on the reflective layer 22 retains a certain thickness. Although affected by the etching solution, the second ITO layer 23 is not completely etched. The second ITO layer 23 can completely cover the reflective layer 22, and effectively protect the underlying reflective layer 22, even if the photoresist is lost.

Figure 7:
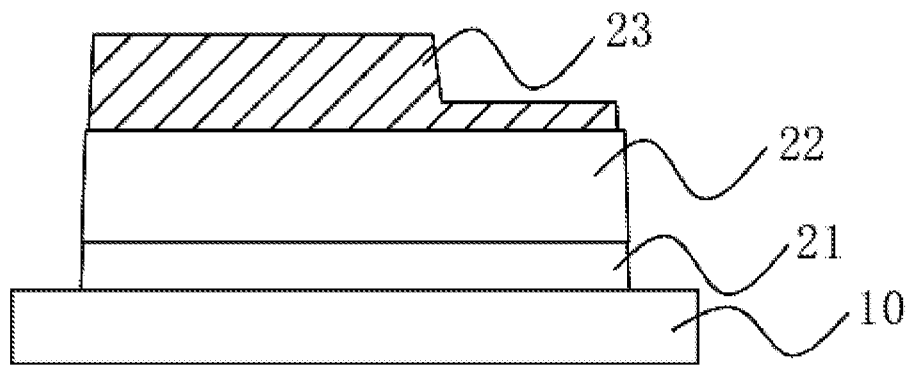

Referring to FIG. 7, after the step S40, the method further includes that the photoresist is stripped, so that after a patterning step, the first ITO layer 21, the reflective layer 22, and the second ITO layer 23 together form a composite anode layer 20. A partial film thickness of the second ITO layer 23 is less than and equal to a film thickness of the first ITO layer 21 after the etching process, and the partial film layer is corresponding to a missing portion of the photoresist.

During the etching process, the film may be left at some positions corresponding to a set etched area, however, the etching residue is not allowed to exist in the etching process, so in the actual etching process, a certain percentage of etching time (usually referred to as over-etching time) is extended on a calculated average etching time to ensure no etching residue. When the percentage of the over-etching time of the first ITO layer 21 is set to 30%, the film thickness of the second ITO layer 23 is more than 1.5 times of the thickness of the first ITO layer 21 in a specific manufacture, so as to ensure that a portion of the second ITO layer 23 corresponding to a region of the photoresist lost retains a certain thin thickness, and protecting the underlying reflective layer 22 from etching.

Step S50, forming an OLED light emitting layer (not shown) on the anode layer 20.

In details, the OLED light emitting layer is formed on the anode layer 22, and the OLED light emitting layer includes a hole injection, a hole transport layer, a light emitting material layer, an electron transport layer, and an electron injection layer. The method further includes that a cathode is formed on the OLED light emitting layer.

The method of the present disclosure is also applicable to other structure for forming a three-layer film layer, particularly suitable for the case where a top layer of the vapor-deposited film is lost, causing adverse effects.

An embodiment of the present disclosure further provides an OLED display panel by the above method, the OLED display panel includes an array substrate 10, an anode 20, and an OLED light emitting layer formed on the anode layer.

The array substrate 10 includes a base substrate and a thin film transistor array disposed on the base substrate.

The anode 20 is formed on the array substrate 10, and the anode layer 20 includes a first Indium tin oxide (ITO) layer 21, a reflective layer 22, and a second ITO layer 23 disposed in order. The second ITO layer 23 covers the reflective layer 22, and a partial film thickness of the second ITO layer 23 is greater than a film thickness of the first ITO layer 21. For the specific structure of the anode layer 20, please refer to the structure by the above method, and details are not to be described herein.

Beneficial performances of an embodiment of the present disclosure are that, in a method for manufacturing an OLED display panel of the embodiment of the present disclosure, by increasing a film thickness of a top ITO layer, a surface of the underlying metal layer is prevented from being affected because of the photoresist lost during an etching process, and thereby ensuring a quality stability of the OLED display panel.

In summary, although the preferable embodiments of the present disclosure have been disclosed above. It should be noted that those of ordinary skill in the art can make a variety of improvements and substitutions on the premise of not deviating from the technical principle of the present disclosure, and these improvements and substitutions should be encompassed within the protection scope of the present disclosure.

What is claimed is:

1. An organic light emitting diode (OLED) display panel, comprising:
    an array substrate comprising a base substrate and a thin film transistor array disposed on the base substrate;
    an anode layer formed on the array substrate, the anode layer comprising a first indium tin oxide (ITO) layer, a reflective layer, and a second ITO layer disposed in order; and
    an OLED light emitting layer formed on the anode layer;
    wherein the second ITO layer covers the reflective layer; at least one concave is defined on the second ITO layer; a film thickness of a first part of the second ITO layer where the concave is defined is thinner than a film thickness of the first ITO layer; a film thickness of a second part of the second ITO layer different from the first part is greater than the film thickness of the first ITO layer; and a material of the reflective layer is a silver metal.

2. The OLED display panel according to claim 1, wherein the film thickness of the second ITO layer is twice the film thickness of the first ITO layer.

3. A method for manufacturing an organic light emitting diode (OLED) display panel, comprising a plurality of steps:
    step S10, providing an array substrate comprising a base substrate and a thin film transistor array disposed on the base substrate;
    step S20, forming a first indium tin oxide (ITO) layer, a reflective layer, and a second ITO layer on the array substrate in order, wherein a film thickness of the second ITO layer is greater than a film thickness of the first ITO layer;
    step S30, forming a patterned photoresist on the second ITO layer;
    step S40, etching the second ITO layer, the reflective layer, and the first ITO layer by a same etching process to form a patterned anode layer; and
    step S50, forming an OLED light emitting layer on the anode layer,
    wherein the step S40 comprises:
        step S401, etching the second ITO layer by the photoresist as a self-alignment;
        step S402, etching the reflective layer by the photoresist and the second ITO layer as a self-alignment;
        step S403, etching the first ITO layer by the photoresist and the second ITO layer as a self-alignment, wherein the second ITO layer covers the reflective layer; at least one concave is defined on the second ITO layer by etching; a film thickness of a first part of the second ITO layer where the concave is defined is thinner than the film thickness of the first ITO layer; and a film thickness of a second part of the second ITO layer different from the first part is greater than the film thickness of the first ITO layer.

4. The method for manufacturing the OLED display panel according to claim 3, wherein the film thickness of the second part of the second ITO layer is twice the film thickness of the first ITO layer in the step S20.

5. The method for manufacturing the OLED display panel according to claim 4, wherein an etching time of the second ITO layer is greater than an etching time of the first ITO layer.

6. The method for manufacturing the OLED display panel according to claim 3, wherein the photoresist is stripped so that after a patterning step, the first ITO layer, the reflective layer, and the second ITO layer together form the anode layer, after the step S40.

7. The method for manufacturing the OLED display panel according to claim 3, wherein the step S20 comprises:
step S201, evaporating the first ITO layer on the array substrate;
step S202, evaporating the reflective layer on the first ITO layer, the reflective layer is made of a silver metal material;
step S203, evaporating the second ITO layer on the reflective layer.

8. An organic light emitting diode (OLED) display panel, comprising:
an array substrate comprising a base substrate and a thin film transistor array disposed on the base substrate;
an anode layer formed on the array substrate, the anode layer comprising a first indium tin oxide (ITO) layer, a reflective layer, and a second ITO layer disposed in order; and
an OLED light emitting layer formed on the anode layer;
wherein the second ITO layer covers the reflective layer;
at least one concave is defined on the second ITO layer;
a film thickness of a first part of the second ITO layer where the concave is defined is thinner than a film thickness of the first ITO layer; and a film thickness of a second part of the second ITO layer different from the first part is greater than the film thickness of the first ITO layer.

9. The OLED display panel according to claim 8, wherein the film thickness of the second ITO layer is twice the film thickness of the first ITO layer.

* * * * *